(12) United States Patent
Ma et al.

(10) Patent No.: US 9,058,830 B2
(45) Date of Patent: Jun. 16, 2015

(54) PROCESSING METHOD OF ROW BAR FOR MANUFACTURING SLIDER AND BAR MASK FOR ROW BAR PROCESSING

(75) Inventors: Bing Ma, DongGuan (CN); Weirong Shen, DongGuan (CN); Chuanyu Mo, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 43 days.

(21) Appl. No.: 13/064,693

(22) Filed: Apr. 8, 2011

(65) Prior Publication Data

US 2012/0187080 A1     Jul. 26, 2012

(30) Foreign Application Priority Data

Jan. 26, 2011    (CN) .......................... 2011 1 0028248

(51) Int. Cl.
| | |
|---|---|
| G03F 1/50 | (2012.01) |
| G11B 5/60 | (2006.01) |
| G11B 5/10 | (2006.01) |
| G11B 5/31 | (2006.01) |

(52) U.S. Cl.
CPC ................ G11B 5/6082 (2013.01); G03F 1/50 (2013.01); G11B 5/102 (2013.01); G11B 5/3173 (2013.01)

(58) Field of Classification Search
CPC ............. G03F 1/54; G03F 1/50; G11B 5/102; G11B 5/3173; G11B 5/6082
USPC ............................................................ 430/5
See application file for complete search history.

(56) References Cited

U.S. PATENT DOCUMENTS 4,130,847 A * 12/1978 Head et al. .................... 360/122

* cited by examiner

*Primary Examiner* — Christopher Young
(74) *Attorney, Agent, or Firm* — Nixon & Vanderhye PC (57) ABSTRACT

A bar mask for row bar processing includes at least a slider cover and at least a groove cover arranged adjacent to the slider cover. The groove cover is transparent, and the slider cover is opaque. The slider cover has two extending portions and an ABS portion arranged therebetween with some transparent patterns formed on the ABS portion. The ABS portion covers a single row bar, and the two extending portions each cover a row bar adjacent to the single row bar.

9 Claims, 10 Drawing Sheets

PROCESSING METHOD OF ROW BAR FOR MANUFACTURING SLIDER AND BAR MASK FOR ROW BAR PROCESSING

This application claims the benefit of Chinese Patent Application No. 201110028248.5, filed 26 Jan. 2011, the entire contents of which is hereby incorporated by reference in this application.

FIELD OF THE INVENTION

The present invention relates to information recording disk drive devices, and more particularly, to a method of processing row bars for manufacturing sliders and a bar mask for row bar processing.

BACKGROUND OF THE INVENTION

Perpendicular magnetic recording is a promising recording technique in which magnetic data bits on a magnetic recording disk are defined, such that their magnetic moments are perpendicular to the plane of the magnetic recording disk. The progress to perpendicular recording from longitudinal recording is seen as one of the advances that will allow the continued increase in data densities on magnetic recording disks in the future.

A slider of the perpendicular recording method has a thin film coil for generating a magnetic flux and a magnetic pole layer extending rearward from an air bearing surface and emitting the magnetic flux generated by the thin film coil toward a recording medium. The magnetic pole layer includes, for example, a track width specifying part having a width (uniform width) specifying the recording track width of a recording medium. The height of the track width specifying part in the magnetic pole layer, that is, the distance from the front end (the edge exposed in the air bearing surface) of the track width specifying part to the rear end (the edge on the side far from the air bearing surface) is a neck height and is an important factor contributing to recording performances of the slider. In the slider of the perpendicular recording method, when current is passed to a thin film coil and a magnetic flux for recording is generated, the magnetic flux is emitted from the tip of the track width specifying part of the magnetic pole layer, thereby generating a magnetic field for recording (perpendicular magnetic field), and the surface of the recording medium is magnetized on the basis of the perpendicular magnetic field. In such a manner, information is magnetically recorded on the recording medium. Recently, a composite-type slider has not only the function of performing a recording process on a recording medium, but also the function of performing a reproducing process on the recording medium.

In a process of manufacturing the slider, the magnetic head structure is cut in rows of the magnetic head precursors, thereby providing a plurality of magnetic head row bars. After that, one end face (a cut face of the magnetic head structure) of the magnetic head row bar is polished so that the dimension of each of the polished reproducing head portion and the polished recording head portion becomes a predetermined dimension. More concretely, the MR height of the reproducing head portion becomes a predetermined dimension and the neck height of the recording head portion becomes a predetermined dimension, thereby forming an air bearing surface. After that, the magnetic head row bar in which the air bearing surfaces are formed is cut for magnetic heads, thereby providing a plurality of sliders.

In magnetic head manufacture, since the magnetic head is flying over the media surface (e.g. disk surface) under control of the piezoelectric element (PZT), the magnetic head would fly with a little rotation in order to adjust the fly height. And as known, a magnetic head has air bearing surface design for fly height adjustment, ad the magnetic head edge has a higher chance of touching a media surface during roll flying. To avoid disk damage and improve Hard Disk Interface (HDI) issues, the row bar is designed to possess a plurality of grooves formed between every two slider regions respectively during the row bar manufacturing process. Then the sliders are cut from the row bar with the groove being cut into two parts, so that two chamfers which are formed by the groove are formed on two edges of every slider respectively, and the improvement of the magnetic head fly height precision is achieved.

Figure 1:
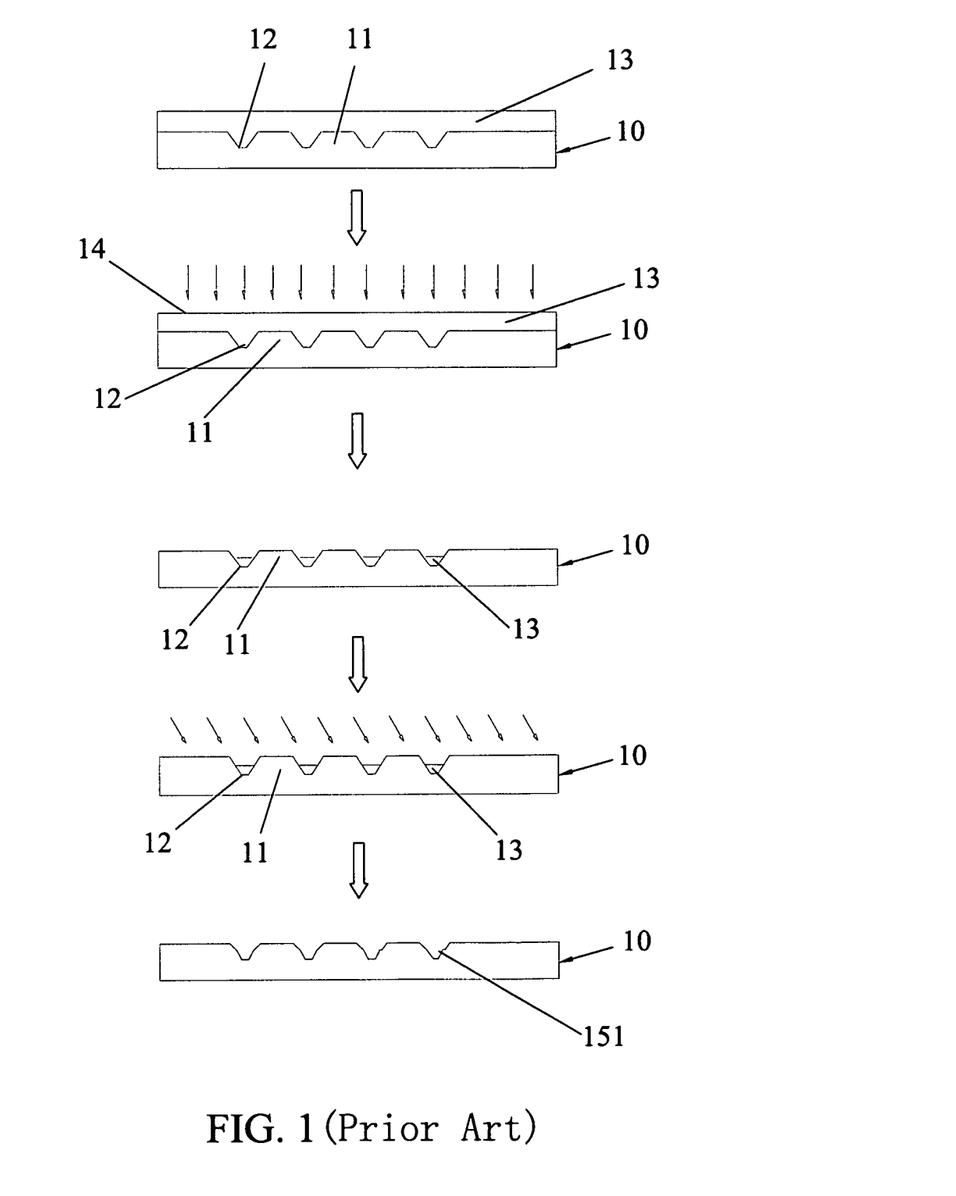
FIG. 1 is a sequence diagram illustrating a traditional process of manufacturing row bar.
Figure 2:
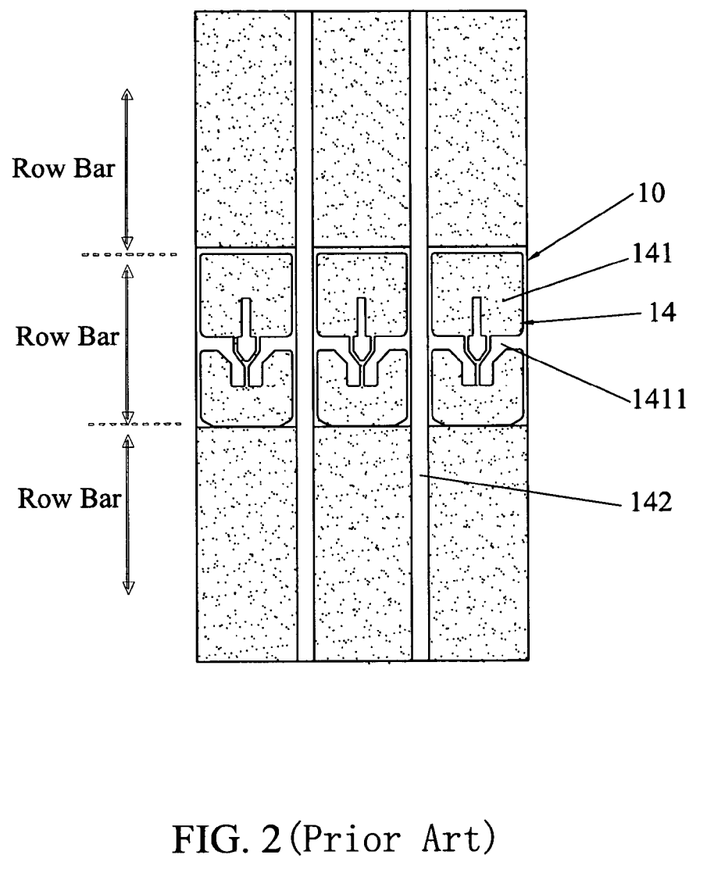
FIG. 2 is a schematic illustration of a row bar with bar mask covered thereon during the traditional exposing process.

In prior art, referring to FIGS. 1-2, the row bar manufacturing process mainly includes the following steps: step one: providing a plurality of row bars 10 arranged in rows, with each row bar 10 having a plurality of slider regions 11 and bar grooves 12 adjacent to the slider region 11; step two: providing photoresist 13 on the whole of the row bars 10; step three: providing a bar mask 14, having slider cover 141 and groove cover 142 which is transparent arranged adjacent to the slider cover 141, the slider cover 141 which is opaque having some transparent patterns 1411 formed thereon; step four: covering the bar mask 14 on one row bar 10, with the slider cover 141 being arranged on the slider regions 11, and the groove cover 142 being arranged on the bar grooves 142; step five: exposing the row bar 10 with the bar mask 14 covered thereon to the light, the other row bars being covered without exposure to the light; step six: carrying out step four to step five until the last row bar is finished being exposed to the light; step seven: developing all of the row bar 10; step eight: etching all the row bar 10. Normally, after step eight, the row bar 10 is to cut into a plurality of sliders 15.

Figure 3A:
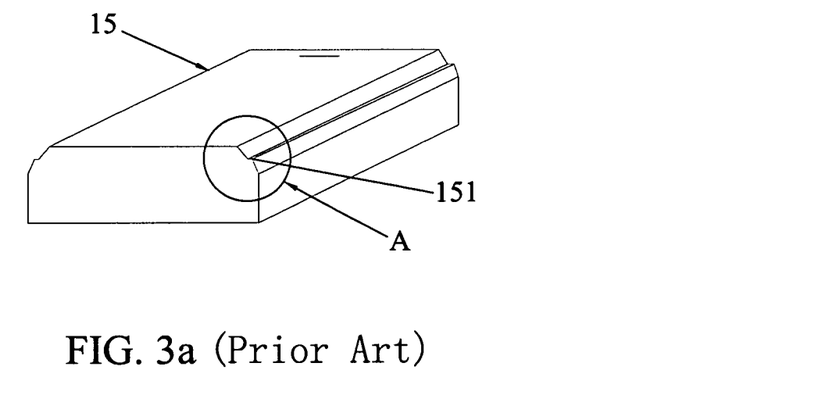
FIG. 3a is a schematic illustration of a slider cut from the row bar after the traditional row bar manufacturing process.
Figure 3B:
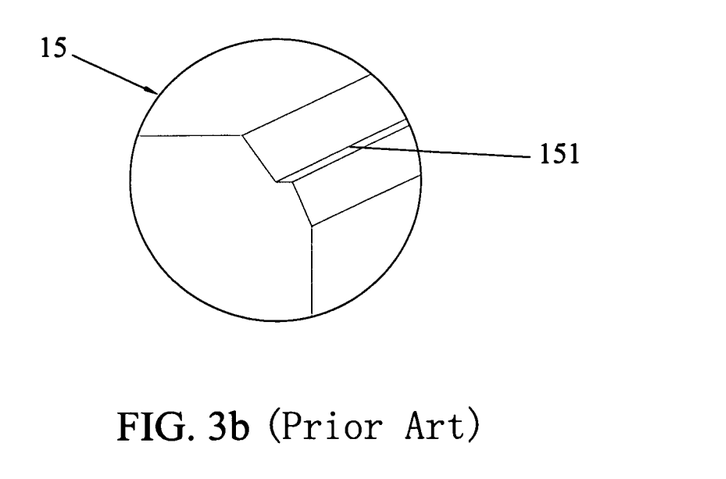

Referring to FIGS. 1-3, after the exposing and developing processes, with deeper bar groove 12 being formed between the slider regions 11, the above-mentioned exposure process is not enough to expose the photoresist 13 in the bar groove 12 due to photoresist 13 being too thick, so that some photoresist 13 is still remaining in the bar groove 12. Thus, during the etching process, the remaining photoresist 13 would cause two steps defects on the chamfer surface 151. Therefore, in this traditional row bar manufacturing process, the slider 15 is obtained with two rough chamfer surfaces 151 on the opposite edges; that is, the chamfer surface possesses a two-step structure. The chance that the slider touches the disk surface during flying is high, and the dust would be retained on the rough chamfer surface, so that the slider and the disk are probably damaged.

Accordingly, a need has arisen for providing an improved row bar processing method for manufacturing sliders, and a bar mask for row bar processing, to overcome the above-mentioned drawbacks.

SUMMARY OF THE INVENTION

One objective of the present invention is to provide a row bar processing method for manufacturing a slider by employing an improved bar mask, with the bar mask having a slider cover and a transparent groove cover, and with the slider cover which is opaque having two extending portions and a ABS portion with some transparent patterns formed thereon. While the light is exposed on the whole bar mark, three adjacent row bars are exposed at the same time, and each bar groove is exposed to the light via the groove cover three times. Accordingly, each bar groove is exposed to the light three times without adding additional exposing processes. Thus, the bar groove is more smooth, and improved slider operation is obtained.

Another objective of the present invention is to provide a bar mask for row bar processing, the bar mask having a slider cover and a transparent groove cover, with the slider cover which is opaque having two extending portions and a ABS portion with some transparent patterns formed thereon. While the light is exposed on the whole bar mark, three adjacent sliders are exposed at the same time, and each bar groove is exposed to the light via the groove cover three times. Accordingly, each bar groove is exposed to the light three times without adding additional exposing processes. Thus, the bar groove is more smooth, and improved slider operation is obtained.

To achieve the above-mentioned objects, the present invention provides a row bar processing method for manufacturing a slider, wherein the processing method includes the following 9 steps: step 1: providing a plurality of row bars arranged in rows accordingly, with each row bar having a plurality of slider regions and bar grooves adjacent to the slider region; step 2: providing photoresist on the whole row bar; step 3: providing a bar mask, having at least a slider cover and at least a groove cover arranged adjacent to the slider cover which is transparent, the slider cover which is opaque having two extending portions and a ABS portion arranged therebetween with some transparent patterns formed thereon; step 4: arranging the ABS portion of the bar mask on the slider region of the first said row bar, one said extending portion being arranged on the slider region of the second said row bar which is adjacent to the first said row bar, then exposing the bar mask to the light, the bar groove being exposed to the light via the groove cover; step 5: arranging the ABS portion of the bar mask on the slider region of the second said row bar, with two said extending portions being arranged respectively on the slider region of the first said row bar and the third said row bar which is adjacent to the second said row bar, then exposing the bar mask to the light, the bar groove being exposed to the light via the groove cover; step 6: arranging the ABS portion of the bar mask on the slider region of the third said row bar, with two said extending portions being arranged respectively on the slider region of the second said row bar and the fourth said row bar which is adjacent to the third said row bar, then exposing the bar mask to the light, the bar groove being exposed to the light via the groove cover; step 7: carrying out step 4 to step 6 in turns until the ABS portions of the bar mask are arranged on the slider regions of the last said row bar, and the bar mask are exposed to the light; step 8: developing the row bars; and step 9: etching the row bars.

As an embodiment of the present invention, the processing method further includes step 10: cutting the sliders from the row bar, with two opposite edges of each slider respectively having one chamfer formed thereon, and the chamfers are formed by the bar groove.

As another embodiment of the present invention, transparent patterns formed on the ABS portion of the bar mask include some curved patterns.

As yet another embodiment of the present invention, the light exposed to the row bar is ultraviolet light.

As still another embodiment of the present invention, the bar mask includes three slider covers and three groove covers arranged adjacent to the slider cover respectively.

As still another embodiment of the present invention, etching the row bar in step 9 is carried out by ion etching.

To achieve the above-mentioned objects, the present invention also provides a bar mask for row bar processing, comprising at least a slider cover and at least a groove cover arranged adjacent to the slider cover which is transparent, the slider cover which is opaque having two extending portions and a ABS portion arranged therebetween with some transparent patterns formed thereon.

As an embodiment of the present invention, the transparent patterns formed on the ABS portion of the bar mask includes some curved patterns.

As an embodiment of the present invention, the bar mask comprises three slider covers and three groove covers arranged adjacent to the slider covers respectively.

In comparison with the prior art, the row bar processing method for manufacturing a slider includes the bar mask having the slider cover and transparent groove cover, the slider cover which is opaque having two extending portions and a ABS portion with some transparent patterns formed thereon. While the light is exposed on the whole bar mark, three adjacent sliders are exposed at the same time, and each bar groove is exposed to the light via the groove cover three times. Accordingly, each bar groove is exposed to the light three times without adding additional exposing processes and, thereby, the bar groove is more smooth, and improved slider operation is obtained.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 3b is an enlarged drawing of the A portion in FIG. 3a;

FIG. 9b is an enlarged drawing of the B portion in FIG. 9a.

DETAILED DESCRIPTION OF ILLUSTRATED EMBODIMENTS

Various preferred embodiments of the invention will now be described with reference to the figures, wherein like reference numerals designate similar parts throughout the various views.

Figure 4:
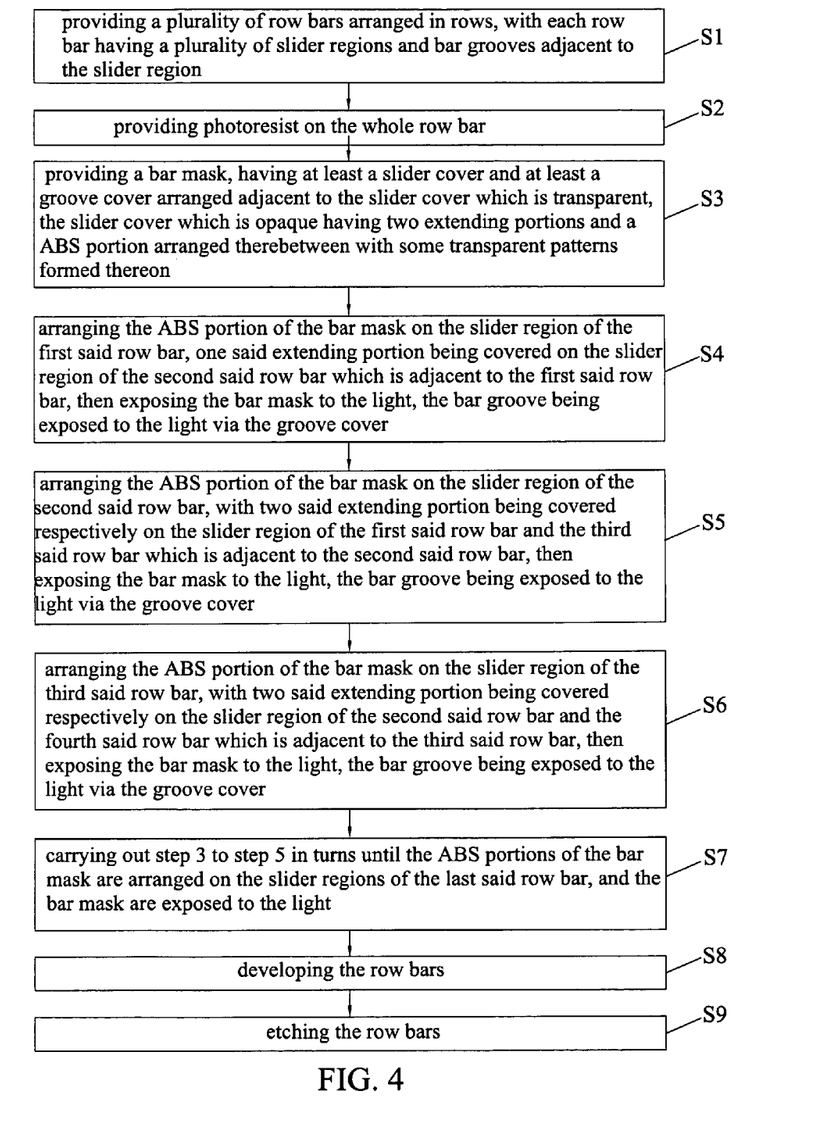
FIG. 4 is a flow chart illustrating a processing method of row bar for manufacturing slider according to an embodiment of the invention.

FIG. 4 is a flow chart illustrating a row bar processing method for manufacturing a slider according to an embodiment of the invention. As indicated above, referring to FIG. 4, the present invention is totally directed to a row bar processing method for manufacturing a slider, and the processing method mainly includes the following nine steps: step one: providing a plurality of row bars arranged in rows, with each row bar having a plurality of slider regions and bar grooves adjacent to the slider region accordingly (S1); step two: providing photoresist on the whole row bar (S2); step three: providing a bar mask, having at least a slider cover and at least a groove cover arranged adjacent to the slider cover which is transparent, the slider cover which is opaque having two extending portions and a ABS portion arranged therebetween with some transparent patterns formed thereon (S3); step four: arranging the ABS portion of the bar mask on the slider region of the first said row bar, one said extending portion being arranged on the slider region of the second said row bar which is adjacent to the first said row bar, then exposing the bar mask to the light, the bar groove being exposed to the light via the groove cover (S4); step five: arranging the ABS portion of the bar mask on the slider region of the second said row bar, with two said extending portions being arranged respectively on the slider region of the first said row bar and the third said row bar which is adjacent to the second said row bar, then exposing the bar mask to the light, the bar groove being exposed to the light via the groove cover (S5); step six: arranging the ABS portion of the bar mask on the slider region of the third said row bar, with two said extending portions being arranged respectively on the slider region of the second said row bar and the fourth said row bar which is adjacent to the third said row bar, then exposing the bar mask to the light, the bar groove being exposed to the light via the groove cover (S6); step seven: carrying out step 4 to step 5 in turns until the ABS portions of the bar mask are arranged on the slider regions of the last said row bar, and the bar mask is exposed to the light (S7); step eight: developing the row bars (S8); step nine: and etching the row bars (S9).

The detailed row bar manufacturing process will be described step by step hereinafter.

Figure 5:
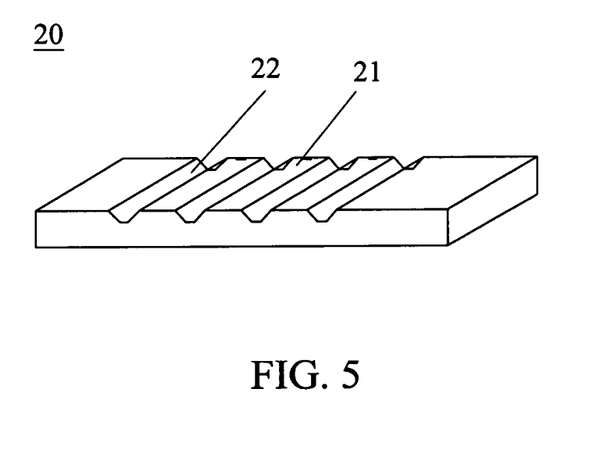
FIG. 5 is a schematic illustration of a row bar according to an embodiment of the invention.

In step one, there is provided a plurality of row bars which are identical to each other arranged in rows, accordingly. FIG. 5 demonstrates one of the row bars. The row bar 20 has a plurality of slider regions 21 and a plurality of bar grooves 22 adjacent to the slider region 21. In detail, the slider region 21 is equipped with a magnetic read head and a magnetic write head, so that it could serve the function of reading information from the disk and/or writing information onto the disk. The bar groove 22 is formed between every two slider regions 21, and each bar groove 22 is a handstand-trapezium. After the above-mentioned nine steps, the row bar 20 is designed to be cut into several parts to form a plurality of sliders, with each slider having a slider region 21, each slider region 21 having one half of bar groove 22 on one side of the slider region 21, and another half of bar groove 22 on one side of the corresponding slider region 21 of the other row bar 20. The bar grooves 22 are cured before step one for preliminary processing, with each bar groove 22 having a total handstand-trapezium groove shape with a rough surface. The following step would be carried out to make smoother the surface of the bar groove 22.

Figure 6:
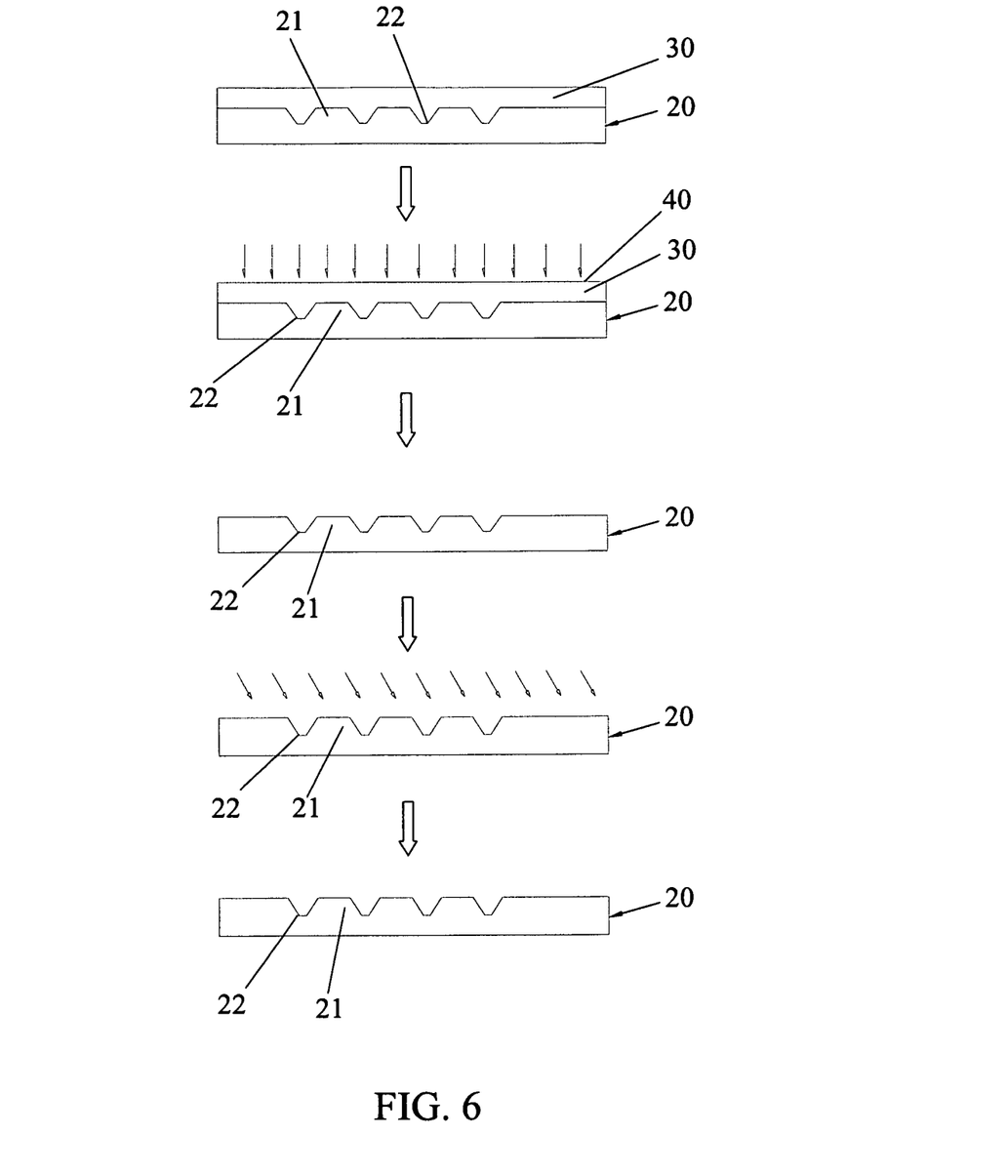
FIG. 6 is a sequence diagram illustrating the process of manufacturing row bar according to an embodiment of the invention.

Referring to FIG. 6, in step two, photoresist 30 is provided on the whole row bar 20, the photoresist 30 is arranged on all the slider regions 21 and all the bar grooves 22. The photoresist 30 could be a negative photoresist or a positive photoresist.

Figure 7:
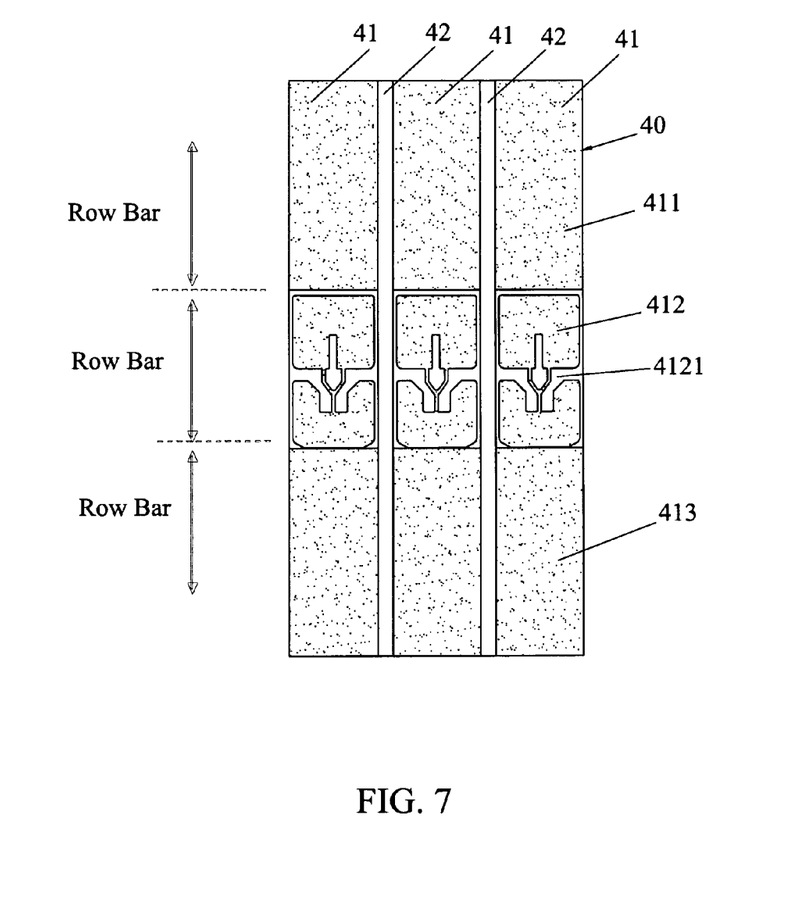
FIG. 7 is a schematic illustration of the row bars with bar mask covered thereon according to an embodiment of the invention.

Referring to FIGS. 6-7, in step three, a bar mask 40 is provided. In this embodiment according to the present invention, the bar mask 40 includes three slider covers 41 and three groove covers 42, with the groove cover 42 arranged adjacent to the slider cover 41. All the groove covers 42 are transparent. Each slider cover 41 has two extending portions and an ABS portion 412. The extending portions consist of the left extending portion 411 and the right extending portion 413, and both of them are opaque. The ABS portion 412 has some transparent patterns 4121 formed thereon. The ABS portion 412 is arranged between left extending portion 411 and the right extending portion 413. In other embodiments according to the present invention, the number of the slider cover and the groove cover could be one or two or above four.

Figure 8A:
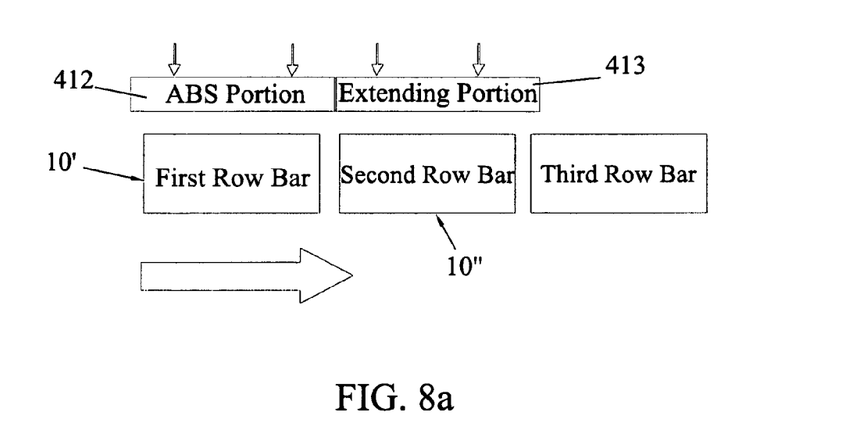
FIGS. 8a-8c is a sequence diagram illustrating the exposing process according to an embodiment of the invention.

Referring to FIG. 6 and FIG. 8a, in step four, the bar mask 40 is arranged on the row bar 10. Concretely, referring to FIGS. 7-8a, the ABS portion 412 of the bar mask 40 is arranged on the slider region 21 of the first row bar 10', with the right extending portion 413 being arranged on the slider region 21 of the second row bar 10" which is adjacent to the first row bar 10'. The groove cover 42 of the bar mask 40 is covered on the bar groove 22 of the first row bar 10' and the second row bar 10". Then the bar mask 40 is exposed to the ultraviolet light (UV light), with the bar grooves 22 the first row bar 10' and the second row bar 10" being exposed to the UV light via the groove cover 42 of the bar mask 40, and the slider region 21 of the first row bar 10' being exposed to the UV light via the transparent patterns 4121 formed on the ABS portion 412 of the bar mask 40.

Figure 8B:
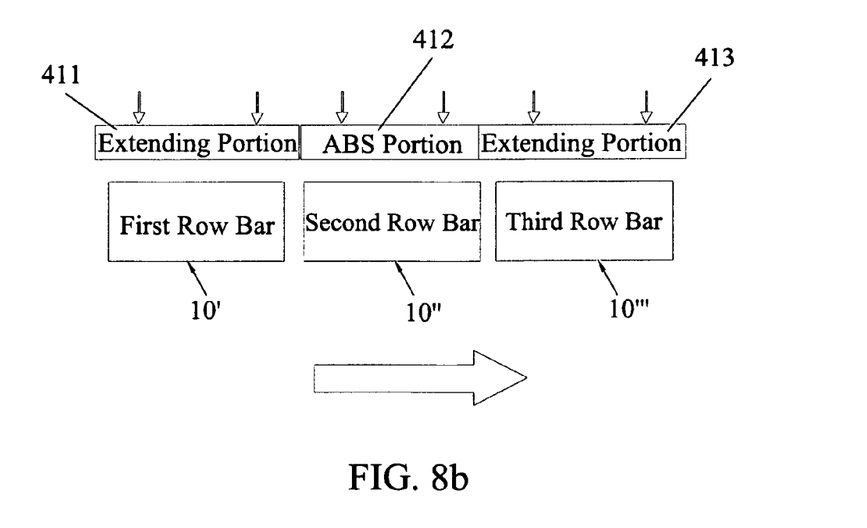

Referring to FIG. 6 and FIG. 8b, in step five, the ABS portion 412 of the bar mask 40 is arranged on the slider region 21 of the second row bar 10", with the left extending portion 411 being arranged on the slider region 21 of the first row bar 10', and the right extending portion 413 being arranged on the slider region 21 of the third row bar 10'''. The first row bar 10' is arranged on the left side of the second row bar 10", and the third row bar 10''' is arranged on the right side of the second row bar 10". The groove cover 42 of the bar mask 40 is arranged on the bar groove 22 of the first row bar 10', the second row bar 10" and the third row bar 10'''. Then the bar mask 40 is exposed to the ultraviolet light (UV light), with the bar grooves 22 of the first row bar 10', the second row bar 10" and the third row bar 10''' being exposed to the UV light via the groove cover 42 of the bar mask 40, and the slider region 21 of the second row bar 10" being exposed to the UV light via the transparent patterns 4121 formed on the ABS portion 412 of the bar mask 40.

Figure 8C:
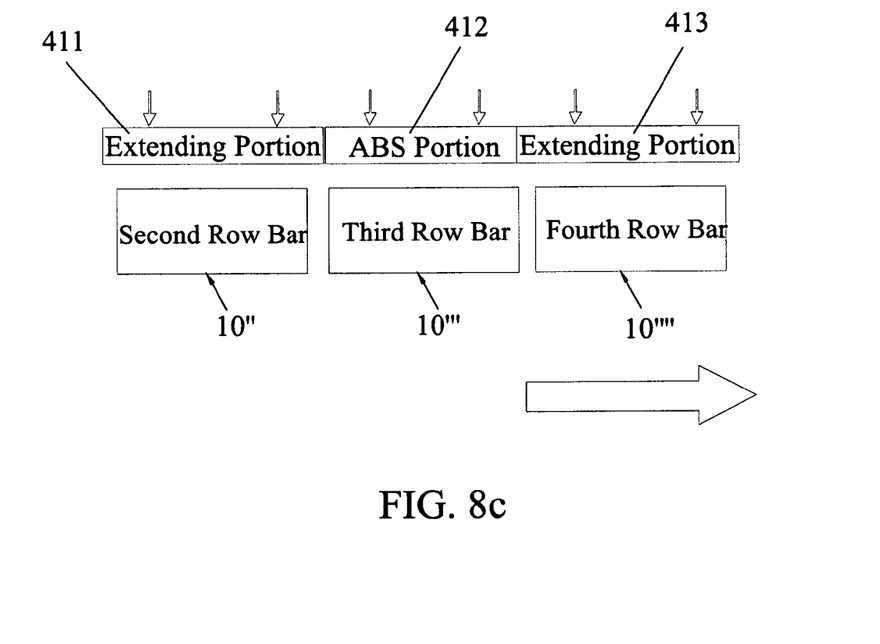

Referring to FIG. 6 and FIG. 8c, in step six, the ABS portion 412 of the bar mask 40 is arranged on the slider region 21 of the third row bar 10''', the left extending portion 411 is arranged on the slider region 21 of the second row bar 10", and the right extending portion 413 is arranged on the slider region 21 of the fourth row bar 10''''. The fourth row bar 10'''' is arranged on the right side of the third row bar 10'''. The groove cover 42 of the bar mask 40 is arranged on the bar groove 22 of the second row bar 10", the third row bar 10''' and the fourth row bar 10''''. Then the bar mask 40 is exposed to the ultraviolet light (UV light), with the bar grooves 22 the second row bar 10", the third row bar 10''' and the fourth row bar 10'''' being exposed to the UV light via the groove cover 42 of the bar mask 40, and the slider region 21 of the third row bar 10''' being exposed to the UV light via the transparent patterns 4121 formed on the ABS portion 412 of the bar mask 40. Thus, the bar grooves 22 of the second row bar 10" are exposed to the UV light three times, and the photoresist 30 in the bar grooves 22 of the second row bar 10" are exposed enough for developing and etching during the row bar manufacturing process.

Referring to FIGS. 6-8c, in step seven, step 5 to step 6 are carried out step by step following the arrowhead shown in FIGS. 8a-8c in turns until the ABS portions 412 of the bar mask 40 are arranged on the slider regions 21 of the last one of the above-mentioned row bars 10. And the bar mask 10 is exposed to the light.

Referring to FIG. 6, in step eight, the row bars 20 are developed. Because the photoresist 30 arranged in each of the bar grooves 22 of the row bar 20 is exposed enough for three times during one exposing process, the photoresist 30 in the bar grooves 22 is all removed during this developing process.

Referring to FIGS. 6-9a, in step nine, the row bars 20 are etched employing ion etching method. After the exposing process, the developing process and the etching process, because the ABS portion 412 of the bar mask 40 possesses some transparent patterns 4121, the corresponding slider region 21 is equipped with some etching patterns to form an air bearing surface (ABS). It should be noted that the transparent patterns 4121 formed on the ABS portion 412 of the bar mask 40 include some curved patterns according to this embodiment. Correspondingly, the ABS of the slider region 21 is equipped with the same curved patterns. The bar grooves 22 are etched to achieve a smooth surface. It should be noted that the etching process could be carried out by other chemical etching or physical etching.

Figure 9A:
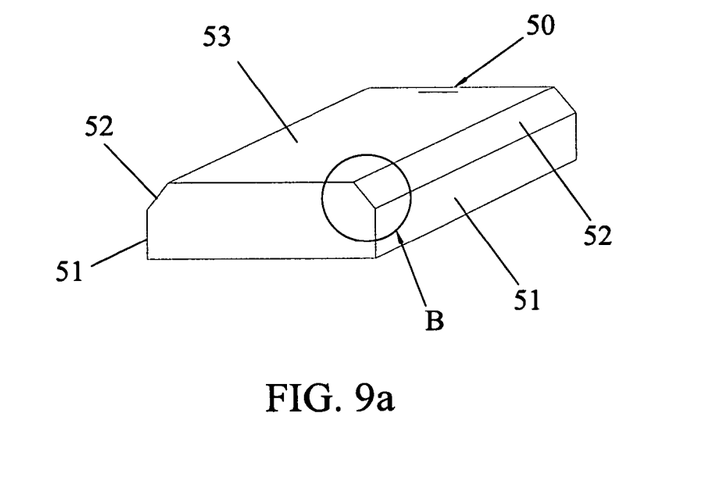
FIG. 9a is a schematic illustration of the slider cut from the row bar according to an embodiment of the invention.
Figure 9B:
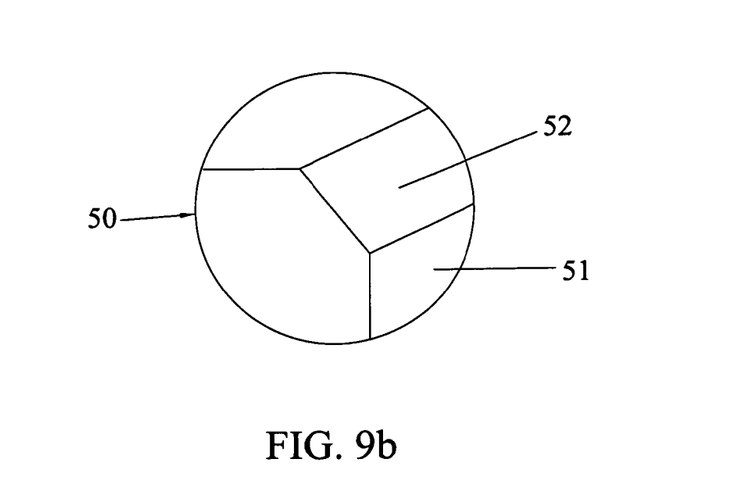

Referring to FIG. 6 and FIGS. 9a-9b, the row bar processing method according to this embodiment of the present invention further includes step 10: cutting the sliders 50 from the row bar 20. The slider 50 has two opposite edges 51, and the bar groove 22 is cut into two halves to form the chamfer 52 on the edges 51. The chamfers 52 extend from the ABS 53 towards two opposite edges 51 of the slider 50 respectively. Owing to the above-mentioned steps two to nine, the chamfer 52 is smooth enough without any two step structure of the traditional process, so as to improve the slider flying adjustment, further improving the slider operation.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A processing method of row bar for manufacturing slider, the method comprising:
    (a) providing a plurality of row bars arranged in rows accordingly, with each row bar having a plurality of slider regions and bar grooves adjacent to the slider region;
    (b) providing photoresist on the whole row bar;
    (c) providing a bar mask, having at least a slider cover and at least a groove cover arranged adjacent to the slider cover, wherein the groove cover is transparent, the slider cover is opaque, and the slider cover has two extending portions and a ABS portion arranged therebetween with some transparent patterns formed on the ABS portion, the two extending portions consist of a first extending portion and a second extending portion, and both the first extending portion and the second extending portion are opaque, and the ABS portion covering a single row bar and the two extending portions each respectively covering a row bar adjacent to the single row bar, and the number of slider covers and groove covers is above four;
    (d) arranging the ABS portion of the bar mask on the slider region of the first said row bar, one said extending portion being arranged on the slider region of the second said row bar which is adjacent to the first said row bar, then exposing the bar mask to the light, the bar groove being exposed to the light via the groove cover;
    (e) arranging the ABS portion of the bar mask on the slider region of the second said row bar, with two said extending portions being arranged respectively on the slider region of the first said row bar and the third said row bar which is adjacent to the second said row bar, then exposing the bar mask to the light, the bar groove being exposed to the light via the groove cover;
    (f) arranging the ABS portion of the bar mask on the slider region of the third said row bar, with two said extending portions being arranged respectively on the slider region of the second said row bar and the fourth said row bar which is adjacent to the third said row bar, then exposing the bar mask to the light, the bar groove being exposed to the light via the groove cover;
    (g) carrying out (e) and (f) in turns until the ABS portions of the bar mask are arranged on the slider regions of the last said row bar, and the bar mask are exposed to the light;
    (h) developing the row bars; and
    (i) etching the row bars.

2. The method according to claim 1, further comprising cutting the sliders from the row bar, with two opposite edges of each slider respectively having one chamfer formed thereon, the chamfers being formed by the bar groove.

3. The method according to claim 1, wherein the transparent patterns formed on the ABS portion of the bar mask comprise curved patterns.

4. The method according to claim 1, wherein the light is ultraviolet light.

5. The method according to claim 1, wherein the bar mask comprises three slider covers and two groove covers arranged adjacent to the three slider covers.

6. The method according to claim 1, wherein the etching is ion etching.

7. A bar mask for row bar processing, comprising:
    at least a slider cover and at least a groove cover arranged adjacent to the slider cover,
    wherein the groove cover is transparent, and the slider cover is opaque,
    wherein the slider cover has two extending portions and an ABS portion arranged therebetween with some transparent patterns formed on the ABS portion,
    wherein the two extending portions consist of a first extending portion and a second extending portion, wherein both the first extending portion and the second extending portion are opaque;
    wherein the ABS portion covers a single row bar and wherein the two extending portions each cover a row bar adjacent to the single row bar; and
    wherein the number of slider covers and groove covers is above four.

8. The bar mask according to claim 7, wherein the transparent patterns, formed on the ABS portion of the bar mask, comprise curved patterns.

9. The bar mask according to claim 7, wherein the bar mask comprises three slider covers and two groove covers arranged adjacent to the three slider covers.

* * * * *